US011506931B2

(12) United States Patent
Zhang et al.

(10) Patent No.: US 11,506,931 B2
(45) Date of Patent: Nov. 22, 2022

(54) BACKLIGHT MODULE AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Zan Zhang, Beijing (CN); Wenyang Li, Beijing (CN); Rui Han, Beijing (CN); Zeyuan Tong, Beijing (CN); Dong Cui, Beijing (CN); Zhipeng Zhang, Beijing (CN); Yue Zhai, Beijing (CN); Shouyang Leng, Beijing (CN); Fengping Wang, Beijing (CN); Weining Chi, Beijing (CN); Dong Guan, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/201,202

(22) Filed: Mar. 15, 2021

(65) Prior Publication Data
US 2021/0200028 A1 Jul. 1, 2021

Related U.S. Application Data

(63) Continuation of application No. PCT/CN2020/099700, filed on Jul. 1, 2020.

(30) Foreign Application Priority Data

Jul. 8, 2019 (CN) .......................... 201910610786.1

(51) Int. Cl.
G02F 1/13357 (2006.01)
G09F 9/30 (2006.01)

(52) U.S. Cl.
CPC .. *G02F 1/133603* (2013.01); *G02F 1/133606* (2013.01); *G09F 9/301* (2013.01)

(58) Field of Classification Search
None
See application file for complete search history.

(56) References Cited

U.S. PATENT DOCUMENTS

2007/0242477 A1 10/2007 Yoo et al.
2018/0120639 A1 5/2018 Shih et al.
(Continued)

FOREIGN PATENT DOCUMENTS

CN 207020427 U 2/2018
CN 207799288 U 8/2018
(Continued)

*Primary Examiner* — Vip Patel
(74) *Attorney, Agent, or Firm* — Dinsmore & Shohl LLP

(57) ABSTRACT

A backlight module and a display device including the backlight module are provided. The backlight module comprises a substrate and a plurality of miniature LEDs arranged on the substrate. The plurality of miniature LEDs comprise a miniature LED array, the miniature LED array comprises a plurality of LED sub-arrays, and the lighting parameters of each LED sub-array in the miniature LED array are independently controlled.

13 Claims, 2 Drawing Sheets

(56) References Cited

U.S. PATENT DOCUMENTS

| | | | |
|---|---|---|---|
| 2018/0190184 A1* | 7/2018 | Kim | H01L 27/3241 |
| 2018/0307096 A1* | 10/2018 | Xie | G02F 1/133603 |
| 2019/0198716 A1* | 6/2019 | Gordon | H01L 33/46 |
| 2020/0074917 A1 | 3/2020 | Li et al. | |

FOREIGN PATENT DOCUMENTS

| | | |
|---|---|---|
| CN | 108490683 A | 9/2018 |
| CN | 109116626 A | 1/2019 |
| CN | 109254451 A | 1/2019 |
| CN | 109459886 A | 3/2019 |
| CN | 210573097 U | 5/2020 |

* cited by examiner

BACKLIGHT MODULE AND DISPLAY DEVICE

CROSS-REFERENCE TO RELATED APPLICATIONS

This application is a continuation of International Application No. PCT/CN2020/099700, as filed on, Jul. 1, 2020, which claims a priority of a Chinese patent application No. 201910610786.1 that was filed on Jul. 8, 2019, and the contents disclosed in any of these applications are incorporated herein by reference in its entirety.

TECHNICAL FIELD

The present disclosure relates to a backlight module and a display device including the backlight module.

BACKGROUND

Liquid crystal display devices have been widely used in daily work and life of people, and their display performance has been continuously increased as people's demand. In addition, in many applications, people expect that the overall thickness of the display device becomes as small as possible, so as to improve the flexibility of the display device and the comfort of the user. The backlight module is an important part of the liquid crystal display device, and the thickness of the backlight module has a great influence on the overall thickness of the entire display device.

SUMMARY

The embodiment of the present disclosure provides a backlight module comprising a substrate and a plurality of miniature LEDs arranged on the substrate, the plurality of miniature LEDs comprising a miniature LED array, the miniature LED array comprising a plurality of LED sub-arrays, and lighting parameters of each LED sub-array in the miniature LED array are independently controlled.

According to some embodiments of the present disclosure, each LED sub-array is composed of M rows of miniature LEDs and M columns of miniature LEDs, and M is an integer greater than or equal to 2.

According to some embodiments of the present disclosure, the backlight module comprises a light diffusion layer located on a side of the miniature LED array away from the substrate, and the light diffusion layer is in direct contact with the miniature LEDs.

According to some embodiments of the present disclosure, a thickness of the light diffusion layer is smaller than a vertical height of the blind area for lighting between adjacent miniature LEDs.

According to some embodiments of the present disclosure, an interval between adjacent miniature LEDs is greater than a thickness of the light diffusion layer.

According to some embodiments of the present disclosure, the light diffusion layer comprises at least two light diffusion films.

According to some embodiments of the present disclosure, materials and/or thicknesses of the at least two diffusion films are different.

According to some embodiments of the present disclosure, the light diffusion film is a bulk diffusion film.

According to some embodiments of the present disclosure, the backlight module further comprises a light conversion layer on a side of the light diffusion layer away from the substrate, and a light converging element and a brightness enhancement film on a side of the light conversion layer away from the substrate. In one embodiment of the present disclosure, the light conversion layer comprises a quantum dot material.

According to some embodiments of the present disclosure, an interval between centers of adjacent LED sub-arrays in the plurality of LED sub-arrays is $\Delta y$, $\Delta y \geq N*1.22*\lambda/d$, where N represents a viewing distance of the backlight module, $\lambda$ represents a wavelength of light most sensitive to human eye, d represents a pupil diameter of the human eye, a width of lighting area of the substrate is W, and N has a value between 3*W and 5*W.

According to some embodiments of the present disclosure, a minimum value of $\Delta y$ is between 0.037 mm and 0.168 mm.

According to some embodiments of the present disclosure, each of a length and a width of area occupied by each LED sub-array in the plurality of LED sub-arrays is greater than or equal to $N*1.22*\lambda/d$, where N represents a viewing distance of the backlight module, $\lambda$ represents a wavelength of light most sensitive to human eye, d represents a pupil diameter of the human eye, a width of lighting area of the substrate is W, and N has a value between 3*W and 5*W.

According to some embodiments of the present disclosure, the miniature LED comprises an unencapsulated miniature LED chip that emits blue light.

According to some embodiments of the present disclosure, the substrate is a flexible substrate.

According to some embodiments of the present disclosure, a minimal interval between two miniature LEDs in a corresponding one of adjacent LED sub-arrays is greater than a minimal distance between the LED sub-array and an edge of the substrate.

Another embodiment of the present disclosure provides a display device, which includes the backlight module as described in any of the foregoing embodiments, and a display panel on the light-emitting side of the backlight module.

According to some embodiments of the present disclosure, a pixel resolution of the display panel is P*Q, the display panel includes a display area, and the display area includes C*D sub-display areas, each sub-display area of the C*D sub-display areas corresponds to a corresponding LED sub-array of the backlight module, where C represents a number of the sub-display areas in each row of the sub-display area and a number of the LED sub-arrays in each row of the LED sub-array in a lengthwise direction, D represents a number of sub-display areas in each column of sub-display areas and a number of the LED sub-arrays in each column of the LED sub-array in a width direction, and C and D are integers by which P and Q are divisible, respectively.

According to some embodiments of the present disclosure, a length and a width of a lighting area of the substrate are L and W, respectively, wherein C is less than $L/\Delta y$, and D is less than $W/\Delta y$, $\Delta y$ represents an interval between centers of adjacent LED sub-arrays in the plurality of LED sub-arrays is, $\Delta y \geq N*1.22*\lambda/d$, where N represents a viewing distance of the backlight module, $\lambda$ represents a wavelength of light most sensitive to human eye, d represents a pupil diameter of the human eye, and N has a value between 3*W and 5*W.

The above briefly describes some embodiments of the present disclosure. These embodiments and the technical features in these embodiments can be combined in different ways to obtain different other embodiments, and these other embodiments also belong to the protection scope of the present application.

BRIEF DESCRIPTION OF THE DRAWINGS

Hereinafter, the embodiments of the present disclosure are described in more detail and by non-limiting examples with reference to the accompanying drawings, so as to provide a thorough understanding of the principle and spirit of the present disclosure, among them.

DETAILED DESCRIPTION

Hereinafter, specific embodiments of the present disclosure will be described in detail by way of examples. It should be understood that the embodiments of the present disclosure are not limited to the examples listed below, and those skilled in the art can use the principles or spirit of the present disclosure to modify and alter the illustrated embodiments to obtain other embodiments having different forms. Obviously, these embodiments all fall within the scope of protection claimed by the present disclosure.

In this disclosure, unless specifically stated, the technical features that are defined using the words of "a", "an", "said" and "the" do not exclude that the relevant technical solution includes a plurality of these technical features. Further, the word "comprising" and "including" used in this specification refer to the presence of the features, elements, or steps listed thereafter, but does not exclude the presence of additional features, elements, steps, or their combination. Moreover, unless otherwise defined, all terms used herein (including technical terms and scientific terms) have the same meanings as commonly understood by the person skilled in the art to which the present disclosure belongs. Terms such as those defined in a common dictionary should be understood to have a meaning consistent with the meaning in the context of this specification, and unless specifically defined herein, they will not be interpreted in ideal or overly formal meanings.

Figure 1:
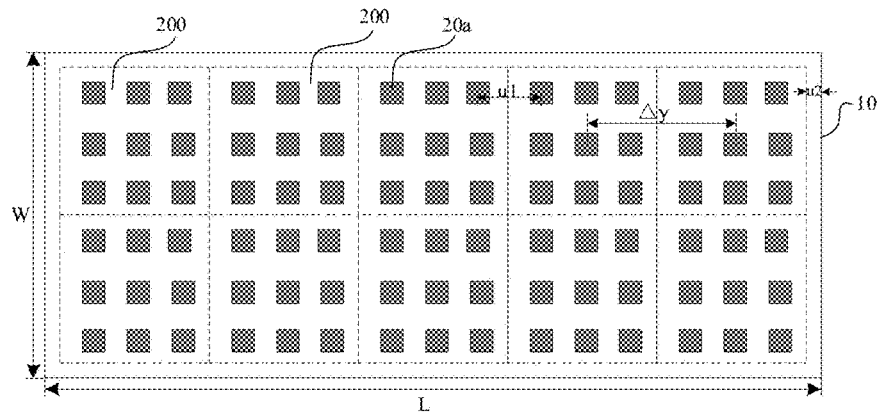
FIG. 1 is a top view schematically illustrating a backlight module according to an embodiment of the present disclosure.

The backlight module provided according to the embodiment of the present disclosure includes a substrate and a plurality of miniature LEDs arranged on the substrate. FIG. 1 shows a schematic top view of the backlight module according to an embodiment of the present disclosure. As shown in FIG. 1, a plurality of miniature LEDs (Mini LED or Micro LED) 20a are arranged on the substrate 10 of the backlight module, the plurality of miniature LEDs include a miniature LED array, and the miniature LED array includes a plurality of LED sub-arrays 200. The lighting parameters of each LED sub-array 200 in the miniature LED array are independently controlled. It can be understood that any number of LED sub-arrays can be provided on the substrate 10, and each LED sub-array can include any number of miniature LEDs.

The miniature LED has a size which is much smaller than that of the conventional LED, and it has a higher luminous efficiency than that of the conventional LED. In addition, since the miniature LEDs can be arranged compactly, the backlight module using the miniature LEDs may not be provided with a light guide plate. Therefore, the overall thickness of the backlight module using the miniature LEDs can be greatly reduced, which also facilitates the reduction of the thickness of the display device using the backlight module, and promotes the application of the display device in different situations. In addition, in the embodiments of the present disclosure, the light emission parameters of each LED sub-array 200 in the miniature LED array in the backlight module are independently controlled, which means that different controls or strategies can be applied to the miniature LEDs in different areas on the substrate of the backlight module according to the image to be displayed, that is, the so-called "local dimming". Therefore, fine control and adjustment of the images to be displayed can be realized, and the quality of the displayed image can be improved. In order to achieve "local dimming", the overall thickness of the assembly of the direct type backlight module using conventional LEDs and the display panel is about 23 mm, and the overall thickness of the assembly of the direct type backlight module using miniature LEDs according to the present disclosure and the display panel which is the same as the above display panel is about 3.8 mm. In addition, for conventional display panels that do not utilize "local dimming", the minimum thickness is about 11 mm. In addition, the size of the miniature LED is smaller than the conventional LED, and for example, the size of the miniature LED can be several hundredths of the size of the conventional LED. For example, a commonly used LED in this field can have a size of 3.0*1.4*0.52 mm, while a commonly used miniature LED in this field has a size of about 0.5*0.3*0.15 mm. For example, the length and width of a conventional LED can be about 2 mm, and the length and width of a miniature LED can be about a few tenths of one millimeter. Therefore, the multiple miniature LEDs in the lighting area of the backlight module can be grouped more finely, so as to implement finer "local dimming". For example, the backlight module provided by the embodiments of the present disclosure can be applied to display devices, for example, the display of the instruments of a motor vehicle or a navigation display device that can display a variety of different screens, thereby reducing the volume and size of these display devices, and improving the quality of the display screen.

As described above, according to embodiments of the present disclosure, each LED sub-array in the backlight module can include any number of miniature LEDs. In some embodiments of the present disclosure, each LED sub-array is composed of M rows of miniature LEDs and M columns of miniature LEDs, and M is an integer greater than or equal to 2. In other words, each LED sub-array roughly forms a square array, which is beneficial to the uniformity of the luminous parameters (for example, luminous brightness) of the area where the single LED sub-array is located, and also facilitates the wire layout in the backlight module. In another embodiment of the present disclosure, the number of rows of the miniature LEDs and the number of columns of the miniature LEDs in each LED sub-array can be different, that is, each LED sub-array can roughly form a rectangular array.

Figure 2:
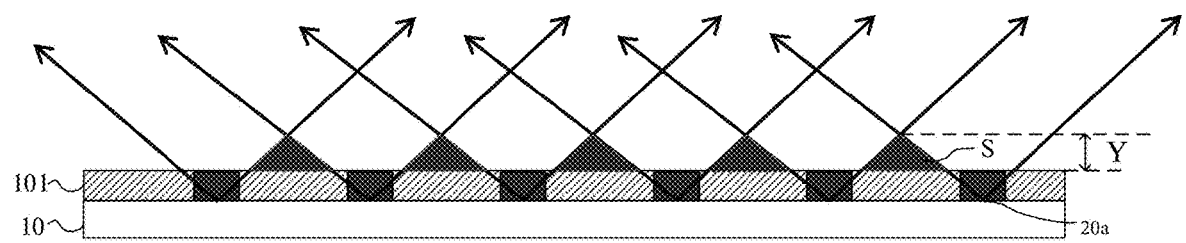
FIG. 2 is a schematic diagram for schematically illustrating the lamp shadow phenomenon that may be caused by a backlight module without a light diffusion layer.

The inventor of the present application has realized in practice that an unfavorable factor that affects the image quality of the display device is the "light shadow" problem. FIG. 2 is used to schematically illustrate the "light shadow"

phenomenon that can be caused by a backlight module without a light diffusion layer. A single LED usually projects light in a certain direction in a certain range. In FIG. 2, the maximum light-emitting range of a single LED is schematically illustrated by arrows. In the example of FIG. 2, the light beam emitted by a single LED is roughly cone-shaped. The light-emitting area of a single LED refers to the area of the light-emitting area with obvious brightness centered on the LED that the user observes through the layer structure above the LED when the LED emits light, and the light-emitting area of a single LED is limited. Since the LEDs are spaced from each other and the light-emitting area of a single LED is limited, when the backlight module without a light diffusion layer is operating, there may exist a dark area between adjacent LEDs from the user's point of view. In other words, there is a blind area S for lighting between adjacent LEDs, and the blind area S for lighting is a "light shadow" from the user's point of view. One measure to reduce the lamp shadow phenomenon is to increase the density of LEDs in the backlight module without a light diffusion layer. The denser the LEDs are arranged, the smaller the size of the blind area S for lighting will be, and the less serious the lamp shadow phenomenon will be. The blind areas S for lighting can even be eliminated. However, the small distance between the adjacent LEDs will cause low heat dissipation efficiency, increase overall power consumption, and reduce the luminous efficiency of the LED. In addition, too dense LEDs will also cause the area of the reflective layer 101 on the surface of the substrate to be correspondingly reduced, which goes against the light utilization efficiency. Another measure to reduce the lamp shadow phenomenon is to increase the distance between the display panel and the backlight module without a light diffusion layer. Specifically, as shown in FIG. 2, the distance between the upper surface of the LED on the substrate of the backlight module without the light diffusion layer and the display panel can be greater than the vertical height Y of the blind area S for lighting shown in FIG. 2. That is, the display panel is arranged above the LED, and the upper surface of the LED of the backlight module without the light diffusion layer and the display panel are separated by at least a vertical height Y. However, this will increase the overall thickness of the display device, which goes against the reduction of the volume of the display device.

In view of the above-mentioned technical knowledge related to the lamp shadow problem, the inventor arranges a light diffusion layer in the backlight module provided in the embodiment of the present disclosure to effectively eliminate the lamp shadow phenomenon and at the same time facilitate the reduction of the thickness of the backlight module. Therefore, in some embodiments of the present disclosure, the backlight module includes a light diffusion layer located above the miniature LED. The light diffusion layer has the function of diffusing light, increasing the light-emitting area of a single miniature LED, and can improve the uniformity of the emitted light. The light diffusion layer can be directly arranged on the miniature LED, that is, the light diffusion layer can be in contact with the miniature LED to reduce the overall thickness of the backlight module. In another embodiment, another suitable layer structure can be provided between the light diffusion layer and the miniature LED. Due to the existence of the light diffusion layer, the light-emitting area of a single LED is actually enlarged. The light diffusion layer can be arranged so that the illumination areas of adjacent miniature LEDs overlap with each other, thereby greatly alleviating or even eliminating the aforementioned lamp shadow phenomenon. In some embodiments, the thickness of the light diffusion layer is much smaller than the aforementioned vertical height Y of the blind area S for lighting between adjacent LEDs, such that the surface of the light diffusion layer facing away from the miniature LED and the miniature LED (i.e., the thickness of the light diffusion layer) is smaller than the vertical height Y of the blind area S for lighting. Therefore, the lamp shadow phenomenon can be effectively reduced and at the same time the reduction of the thickness of the backlight module can be facilitated. In addition, as shown in FIG. 2, the interval between the adjacent miniature LEDs is greater than the vertical height Y of the blind area S for lighting between adjacent LEDs, and thus is greater than the thickness of the light diffusion layer as well.

According to an embodiment of the present disclosure, the light diffusion layer in the backlight module includes a diffusion film located above and in contact with the miniature LEDs. The light diffusion film can diffuse the light emitted from the LEDs, thereby uniformly mixing the light emitted from the respective LEDs. The diffusion film can include a bulk diffusion film made by doping diffusion particles in transparent material. For example, the transparent material can include acrylic, polystyrene (PS), polycarbonate (PC) or PMMA (polymethylmethacrylate), and the diffusion particles can be glass particles, metal particles, metal oxide (such as titanium oxide, barium sulfate, calcium carbonate) particles, coated particles or voids, and so on. In addition, the diffusion film can also be a surface-microstructure diffusion film, for example, a holographic diffusion film. The surface-microstructure diffusion film usually forms a microstructure texture on the surface of a transparent material sheet to diffuse incident light. In addition, the diffusion film can include a thin film substrate and a coating layer coated on the thin film substrate.

In an embodiment of the present disclosure, in order to achieve a better diffusion effect with a thinner thickness, a bulk diffusion film is used, because the bulk diffusion film can increase the diffusion distance compared with the surface-microstructure film. In addition, the shape of the diffusion particles of the bulk diffusion film can be set as required, and for example, can be spherical, cylindrical and so on, thereby increasing the flexibility of the arrangement of the diffusion film.

Figure 3:
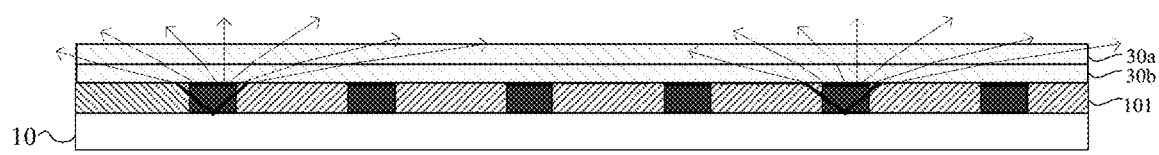
FIGS. 3 and 4 are schematic diagrams for schematically illustrating the application of a light diffusion layer to alleviate the lamp shadow phenomenon.

For example, FIG. 3 shows that the light diffusion layer is composed of two light diffusion films 30a and 30b. Due to the limited thickness of the light diffusion layer formed by existing materials and process, the light diffusion layer comprising only one layer of diffusion film may not provide a sufficient diffusion distance. Therefore, in order to increase the diffusion distance to a greater extent and to diffuse and homogenize the light, so as to achieve the effect of no light spots in the backlight, two diffusion films are arranged above the miniature LED. In the embodiment of the present disclosure, the physical dimensions and materials of the two diffusion films 30a and 30b are approximately the same. In some embodiments, the two diffusion films can be identical. In other embodiments, the materials and/or thicknesses of the diffusion films 30a and 30b can be different, and can be selected from the above embodiments respectively. In the embodiment of the present disclosure, the thicknesses of the diffusion films 30a and 30b can range from one tenth of a millimeter to 1 millimeter according to actual needs. In an embodiment of the present disclosure, the thicknesses of the diffusion films 30a and 30b are both 0.12 mm.

Figure 4:
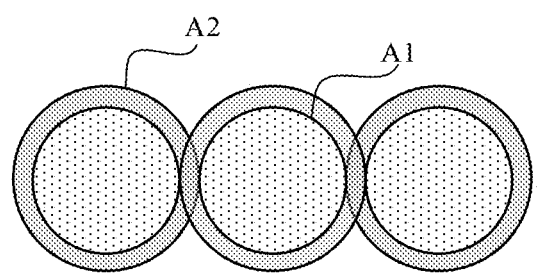

By arranging the diffusion film, the lamp shadow phenomenon can be effectively alleviated or eliminated, and the luminous brightness of the backlight module will not be excessively reduced, thereby improving the quality of the displayed image of the display device. FIG. 3 schematically shows the diffusion of the light emitted from the two LEDs after the light diffusion films 30a, 30b are provided, and FIG. 4 schematically shows the top views of the miniature LEDs in the light-emitting state in two scenarios in which the light diffusion layer is not provided and the light diffusion layer is provided. The circle A1 with a smaller diameter in FIG. 4 represents the light-emitting area of the miniature LED when the light diffusion layer is not provided. At this time, the user can clearly perceive that there is a gap between the light-emitting areas between adjacent LEDs. Such a gap is an obvious dark area between the adjacent LEDs from the user's point of view, that is, the above-mentioned lamp shadow phenomenon. The circle A2 with a greater diameter in FIG. 4 represents the light emitting area of the miniature LED when the light diffusion layer is provided. At this time, the light-emitting area of a single LED is enlarged so that the light-emitting areas of adjacent miniature LEDs overlap with each other. Therefore, the lamp shadow phenomenon can be significantly alleviated.

Figure 5:
FIG. 5 is a cross-sectional view schematically illustrating a backlight module according to another embodiment of the present disclosure.

FIG. 5 schematically shows a structural diagram of a backlight module according to another embodiment of the present disclosure. As shown in FIG. 5, the backlight module includes a substrate 10, a plurality of miniature LEDs 20a disposed on the substrate, a light diffusion layer 30 on the miniature LEDs, a light conversion layer 40 located above the light diffusion layer 30, and a light condensing element 50 and a brightness enhancement film 60 on the light conversion layer 40. The light conversion layer 40 includes a quantum dot material. The quantum dot material in the light conversion layer can convert the light emitted from the miniature LED into light of desired color (for example, white light). In some embodiments, the light conversion layer 40 can include other fluorescent materials. In some embodiments, the aforementioned miniature LED includes an unencapsulated miniature LED chip that can emit blue light. The blue light emitted from the miniature LED can be converted into white light via the light conversion layer 40, thereby providing a suitable backlight for the display panel. The light condensing element 50 can convert the light emitted from the light conversion layer 40 into collimated light or condensed light. In the embodiment of the present disclosure, the light condensing element 50 can be a micro lens array, a prism array, a grating array, or the like. The brightness enhancement film 60 can increase the brightness of the backlight provided by the backlight module. The backlight module provided by the embodiment of the present disclosure is not provided with a light guide plate, which reduces the thickness of the backlight module. At the same time, the above-mentioned light diffusion layer, light conversion layer, light condensing element and brightness enhancement film can enable the backlight module to provide a good backlight. At the same time, the lamp shadow phenomenon can be significantly alleviated. In another embodiment, the substrate 10 is a flexible substrate, so that a flexible display device can be implemented. In the example of FIG. 5, the backlight module further includes a back plate 70, so as to provide support and protection for the foregoing various structures of the backlight module. In addition, although FIG. 5 schematically shows an example of various elements of the backlight module, the arrangement order of these elements is not limited to FIG. 5. For example, the light conversion layer 40 can be provided under the light diffusion layer 30, and the arrangement order of the brightness enhancement film 60 and the light condensing element 50 can be interchanged. Those skilled in the art can make any suitable adjustments to the stacking order of them without affecting the function of the backlight. According to an embodiment of the present disclosure, a light reflective material can be arranged on an area of the surface of the substrate 10 that is not occupied by miniature LEDs, so that the light irradiated on the surface of the substrate 10 is reflected to the light diffusion layer by the reflective material, thereby improving the effectiveness of the usage of light. In addition, although FIG. 5 shows that the light diffusion layer 30 is in contact with the miniature LED, in other embodiments, there can be any suitable structure between the miniature LED and the light diffusion layer 30, such as a heat dissipation or heat insulation layer and so on.

In the embodiment of the present disclosure, a case where the diffusion layer 30 is composed of two overlapping diffusion films has been described as an example. Those skilled in the art can understand that, according to the actual situation and the requirements for the uniformity of the backlight, the diffusion layer 30 can also be composed of one diffusion film, or composed of more than two diffusion films depending on the capability of diffusing and equalizing light of the diffusion layer. In addition, in another embodiment of the present disclosure, the diffusion films constituting the diffusion layer 30 may not be adjacent to each other, and other layers of the backlight module can be sandwiched between the diffusion films, such as polarizing film, brightness enhancement film and light conversion layer and so on. In addition, the material and specific parameters of the diffusion film constituting the diffusion layer 30 can be selected according to actual needs, and the materials and parameters of each diffusion film can be different from each other.

The backlight module provided by the embodiments of the present disclosure can be applied to various scenarios. Below, specific examples are used to further illustrate the application of the backlight module provided by the embodiments of the present disclosure.

According to an embodiment of the present disclosure, the backlight module is applied to a display device, and a local dimming strategy is adopted to control the miniature LEDs of the backlight module. Due to the local dimming method, it is necessary to divide the plurality of miniature LEDs in the lighting area of the substrate into multiple LED sub-arrays as mentioned above, and the light-emitting parameters of each LED sub-array can be independently controlled. The area where each LED sub-array is located also corresponds to a sub-display area of the display panel. The size of the sub-display area can be determined based on the resolution limit of the human eye. According to the Rayleigh criterion, the minimum size of the image area that can be distinguished by the human eye on the display device can be expressed as: $N*1.22*\lambda/d$, where N represents the distance between the eye of the viewer and the display device (i.e., the viewing distance of the backlight module), $\lambda$ represents the wavelength of the light most sensitive to the human eye, and d represents the pupil diameter of the human eye. In one embodiment of the present disclosure, assuming that the width of the lighting area of the substrate is W, N can have the value between $3*W$ and $5*W$. The pupil diameter d of the human eye is roughly in the range of 2 mm-9 mm. In an example, the pupil diameter d can be a value of 5 mm, $\lambda$ is 5500 angstroms, and the distance N from the viewer's eyes to the display device is 50 cm (for example, in the case that the display device is the display device of the instrument of the vehicle). At this time, based on the above formula, it can be obtained that the minimum size of the image area that can be distinguished by the human eye is about 0.067 mm. Correspondingly, the interval $\Delta y$ between the centers of the adjacent LED sub-arrays shown in FIG. 1 can be greater than or equal to the minimum size of the image area that can be distinguished by the human eye, i.e., $\Delta y \geq N*1.22*\lambda/d$. That is to say, the minimum value $\Delta y_{min}$ of the interval $\Delta y$ between the centers of the adjacent LED sub-arrays can be the minimum size of the image area that can be distinguished by the human eye, i.e., $\Delta y_{min}=N*1.22*\lambda/d$. In the above example, when the minimum size of the image area that can be distinguished by the human eye is about 0.067 mm, the minimum value $\Delta y_{min}$ of the interval $\Delta y$ between the centers of the adjacent LED sub-arrays in the backlight module can be about 0.067 mm. Therefore, in an embodiment of the present disclosure, the minimum value $\Delta y_{min}$ of the interval $\Delta y$ between the centers of the adjacent LED sub-arrays is greater than or equal to 0.067 mm.

The person skilled in the art can understand that the pupil diameter d can vary according to the light intensity of the ambient, and the variation range of the pupil diameter d of the human eye is generally in the range of 2 mm-9 mm. When the pupil diameter d of the human eye is 2 mm, in the condition in which $\lambda$ is 5500 angstroms and the distance N from the viewer's eyes to the display device is 50 cm, the minimum size of the image area that can be distinguished by the human eye calculated based on the above equation is 0.168 mm, thus the minimum value $\Delta y_{min}$ of the interval $\Delta y$ between the centers of the adjacent LED sub-arrays is 0.168 mm. In addition, when the pupil diameter d of the human eye is 9 mm, in the same condition, the minimum size of the image area that can be distinguished by the human eye calculated based on the above equation is 0.037 mm, thus the minimum value $\Delta y_{min}$ of the interval $\Delta y$ between the centers of the adjacent LED sub-arrays is 0.037 mm. Accordingly, according to the required pupil diameter d of the viewer of the display device, the minimum value $\Delta y_{min}$ of the interval $\Delta y$ between the centers of the adjacent LED sub-arrays in the backlight module can be in the range between 0.037 mm and 0.168 mm. However, normally, the pupil diameter d of the human eye can be selected as 5 mm, and the minimum value $\Delta y_{min}$ of the interval $\Delta y$ between the centers of the adjacent LED sub-arrays in the backlight module can be set as about 0.067 mm.

In addition, as shown in FIG. 1, the minimal interval u1 between two miniature LEDs in the corresponding one of the adjacent LED sub-arrays is greater than the minimal distance u2 between the LED sub-array 200 and the edge of the substrate 10.

As shown in FIG. 1, assuming that the length and width of the lighting area of the backlight module corresponding to the display area of the display device are L and W respectively, and the interval between the centers of the adjacent LED sub-arrays is $\Delta y$, the number C of the LED sub-arrays in each row of the LED sub-arrays in the lengthwise direction is $L/\Delta y$, and the number D of the LED sub-arrays in each column of the LED sub-arrays in the width direction is $W/\Delta y$. In on embodiment of the present disclosure, the calculated interval $\Delta y$ between the centers of the adjacent LED sub-arrays is greater than or equal to the above calculated 0.067 mm. In an embodiment of the present disclosure, the size of the lighting area of the substrate of the backlight module is 292.302*109.512 mm. Therefore, in the length direction, a maximum of 175 LED sub-array areas can be divided, and in the width direction, a maximum of 65 LED sub-array areas can be divided.

In one embodiment of the present disclosure, when the size of the sub-display area is determined based on the resolution limit of the human eye, it can make the length and width of the area occupied by each LED sub-array in the plurality of LED sub-arrays equal to the minimum size of the image area that can be distinguished by the human eye. Similar to the above description, each of the length and the width of the area occupied by each LED sub-array in the plurality of LED sub-arrays is greater than or equal to $N*1.22*\lambda/d$, where N represents the viewing distance of the backlight module, $\lambda$ represents the wavelength of light most sensitive to the human eye, d represents the pupil diameter of the human eye, the width of the lighting area of the substrate is W, and N can have the value between 3*W and 5*W. Similar to the above description, the minimal value of each of the length and width of the area occupied by each LED sub-array in the plurality of LED sub-arrays is in the range between 0.037 mm and 0.168 mm, and normally, the minimal value of each of the length and width of the area occupied by each LED sub-array in the plurality of LED sub-arrays is set as about 0.067 mm.

In an embodiment of the present disclosure, the number of LED sub-array areas in the backlight module is considered in view of the pixel resolution of the display panel, so as to achieve more accurate local dimming. If the pixel resolution of the display panel is P*Q, the display area of the display panel can be divided into a plurality of sub-display areas, each sub-display area corresponding to a respective LED sub-array on the substrate of the backlight module. Therefore, the number of the sub-display areas of the display panels and the number of the LED sub-arrays of the backlight module are the same, i.e., there are both C*D. Therefore, C represents both the number of the LED sub-arrays in each row of the LED sub-array in the lengthwise direction and the number of the sub-display areas in each row of the sub-display areas in the lengthwise direction. Similarly, D represents both the number of the LED sub-arrays in each column of the LED sub-array in the width direction and the number of the sub-display areas in each column of the sub-display areas in the width direction. In this condition, C and D are integers by which P and Q are divisible, respectively. In an example, if the pixel resolution of the display panel is 1920*720, C can be an integer by which 1920 is divisible, for example, 192, 160, 120, 96, 80 . . . , D can be an integer by which 720 is divisible, for example, 72, 60, 48, 45, 40, 36 . . . . In order to facilitate the uniformity of the luminous parameters in the area where each LED sub-array is located, and to facilitate the wire layout in the backlight module. Each sub-lighting area can be made as close as possible to a square, so that a square LED sub-array can be arranged in each sub-lighting area. The greater the values of C and D, the better for the fine control of the display screen. However, this also requires a greater number of control chips, leading to increased costs and heat dissipation problems. According to an embodiment of the present disclosure, the size of the lighting area of the substrate of the backlight module is 292.302*109.512 mm, the above-mentioned parameter C takes the value 40, and the parameter D takes the value 15, that is, the multiple miniature LEDs of the backlight module are divided into 600 LED sub-arrays, the length and width of the area occupied by a single LED sub-array are about 7.3 mm. Further, in this embodiment, each LED sub-array includes 5 rows of miniature LEDs and 5 columns of miniature LEDs, that is, each LED sub-array includes 25 miniature LEDs so as to achieve a suitable density of LED layout, which is beneficial to the heat dissipation of the backlight module, and reduce the lamp shadow phenomenon.

Another embodiment of the present disclosure provides a display device, including the backlight module of any of the foregoing embodiments and a display panel on the light-emitting side of the backlight module.

As described above, according to the embodiment of the present disclosure, the display panel includes a display area, the display area includes C*D sub-display areas. In each of the C*D sub-display areas, a corresponding LED sub-array of the backlight module is arranged, where C represents the number of sub-display areas in each row of sub-display areas and the number of the LED sub-arrays in each row of the LED sub-array in the lengthwise direction, and D represents the number of sub-display areas in each column of sub-display areas and the number of the LED sub-arrays in each column of the LED sub-array in the width direction. If the pixel resolution of the display panel of the display device is P*Q, then C and D are integers by which P and Q are divisible, respectively.

The display device provided by the embodiment of the present disclosure can be a vehicle-mounted instrument display. As previously discussed, a local dimming strategy can be used to control the miniature LEDs of the backlight module. Considering the resolution limit of the human eye, the minimum size of the area of a single LED sub-array in the display device can be above-described $\Delta y$. Therefore, if the length and width of the lighting area of the substrate of the backlight module are L mm and W mm, respectively, the aforementioned parameter C is less than $L/\Delta y$, and the parameter D is less than $W/\Delta y$. In one embodiment of the present disclosure, the calculated minimal size of $\Delta y$ can be about 0.067 mm, and thus the parameter C is less than $L/0.067$, and the parameter D is less than $W/0.067$.

The exemplary embodiments of the present disclosure are described in detail above, but those skilled in the art can understand and realize other modifications to the disclosed embodiments based on the study of the drawings, the specification and the claims when implementing the present disclosure. In the claims, the word "comprising" does not exclude the presence of other elements. Although some features are recited in different dependent claims, the present disclosure is also intended to cover the embodiments having the combination of these features.

What is claimed is:

1. A display device, comprising a backlight module and a display panel on a light emitting side of the backlight module, the backlight module comprising a substrate and a plurality of miniature LEDs arranged on the substrate, the plurality of miniature LEDs comprising a miniature LED array, the miniature LED array comprising a plurality of LED sub-arrays, and lighting parameters of each LED sub-array in the miniature LED array are independently controlled, wherein each of a length and a width of area occupied by each LED sub-array in the plurality of LED sub-arrays is greater than or equal to $N*1.22*\lambda/d$, where N represents a viewing distance of the backlight module, $\lambda$ represents a wavelength of light most sensitive to human eye, d represents a pupil diameter of the human eye, a width of lighting area of the substrate is W, and N has a value between 3*W and 5*W, a pixel resolution of the display panel is P*Q, the display panel includes a display area, and the display area includes C*D sub-display areas, each sub-display area of the C*D sub-display areas corresponds to a corresponding LED sub-array of the backlight module, where C represents a number of the sub-display areas in each row of the sub-display area and a number of the LED sub-arrays in each row of the LED sub-array in a lengthwise direction, D represents a number of sub-display areas in each column of sub-display areas and a number of the LED sub-arrays in each column of the LED sub-array in a width direction, and C and D are integers by which P and Q are divisible, respectively, and a length and the width of a lighting area of the substrate are L and W, respectively, wherein C is less than $L/\Delta y$, and D is less than $W/\Delta y$, $\Delta y$ represents an interval between centers of adjacent LED sub-arrays in the plurality of LED sub-arrays is, $\Delta y \geq N*1.22*\lambda/d$.

2. The display device of claim 1, wherein each LED sub-array is composed of M rows of miniature LEDs and M columns of miniature LEDs, and M is an integer greater than or equal to 2.

3. The display device of claim 1, wherein the backlight module comprises a light diffusion layer located on a side of the miniature LED array away from the substrate, and the light diffusion layer is in direct contact with the miniature LEDs.

4. The display device of claim 3, wherein a thickness of the light diffusion layer is smaller than a vertical height of a blind area for lighting between adjacent miniature LEDs.

5. The display device of claim 3, wherein an interval between adjacent miniature LEDs is greater than a thickness of the light diffusion layer.

6. The display device of claim 3, wherein the light diffusion layer comprises at least two light diffusion films.

7. The display device of claim 6, wherein materials and/or thicknesses of the at least two diffusion films are different.

8. The display device of claim 6, wherein the light diffusion film is a bulk diffusion film.

9. The display device of claim 3, wherein the backlight module further comprises a light conversion layer on a side of the light diffusion layer away from the substrate, and a light converging element and a brightness enhancement film on a side of the light conversion layer away from the substrate.

10. The display device of claim 9, wherein the light conversion layer comprises a quantum dot material.

11. The display device of claim 1, wherein the miniature LED comprises an unencapsulated miniature LED chip that emits blue light.

12. The display device of claim 1, wherein the substrate is a flexible substrate.

13. The display device of claim 1, wherein a minimal interval between two miniature LEDs in a corresponding one of adjacent LED sub-arrays is greater than a minimal distance between the LED sub-array and an edge of the substrate.

* * * * *